(12) United States Patent
DeHaven et al.

(10) Patent No.: US 7,951,708 B2
(45) Date of Patent: May 31, 2011

(54) COPPER INTERCONNECT STRUCTURE WITH AMORPHOUS TANTALUM IRIDIUM DIFFUSION BARRIER

(75) Inventors: Patrick W. DeHaven, Hopewell Junction, NY (US); Daniel C. Edelstein, Yorktown Heights, NY (US); Philip L. Flaitz, Hopewell Junction, NY (US); Takeshi Nogami, Albany, NY (US); Stephen M. Rossnagel, Yorktown Heights, NY (US); Chih-Chao Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 12/477,389

(22) Filed: Jun. 3, 2009

(65) Prior Publication Data
US 2010/0311236 A1  Dec. 9, 2010

(51) Int. Cl.
*H01L 21/44* (2006.01)
(52) U.S. Cl. . 438/653; 257/751; 257/767; 257/E21.579; 438/627; 438/643

(58) Field of Classification Search .......... 257/751, 257/767, E21.579; 438/627, 643, 653
See application file for complete search history.

(56) References Cited

U.S. PATENT DOCUMENTS

| | | | |
|---|---|---|---|
| 5,234,774 A * | 8/1993 | Hasegawa et al. | 428/610 |
| 6,181,012 B1 | 1/2001 | Edelstein et al. | |
| 6,294,836 B1 * | 9/2001 | Paranjpe et al. | 257/767 |
| 6,399,496 B1 | 6/2002 | Edelstein et al. | |
| 6,787,912 B2 | 9/2004 | Lane et al. | |
| 6,812,143 B2 | 11/2004 | Lane et al. | |
| 2007/0117308 A1* | 5/2007 | Hu | 438/238 |
| 2010/0176511 A1* | 7/2010 | Maekawa et al. | 257/751 |

* cited by examiner

*Primary Examiner* — Asok K Sarkar
(74) *Attorney, Agent, or Firm* — Cantor Colburn LLP; Steven Capella

(57) ABSTRACT

A method of forming a diffusion barrier for use in semiconductor device manufacturing includes depositing, by a physical vapor deposition (PVD) process, an iridium doped, tantalum based barrier layer over a patterned interlevel dielectric (ILD) layer, wherein the barrier layer is deposited with an iridium concentration of at least 60 atomic % such that the barrier layer has a resulting amorphous structure.

13 Claims, 11 Drawing Sheets

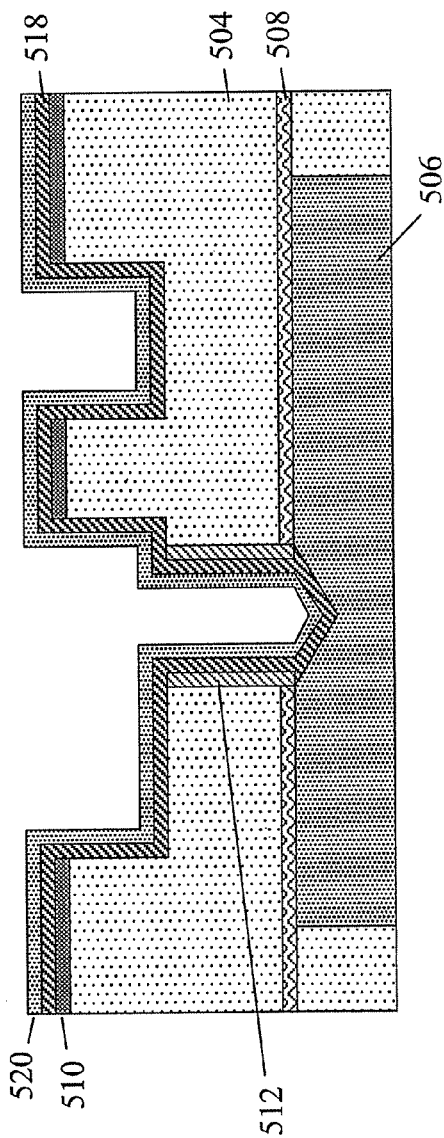
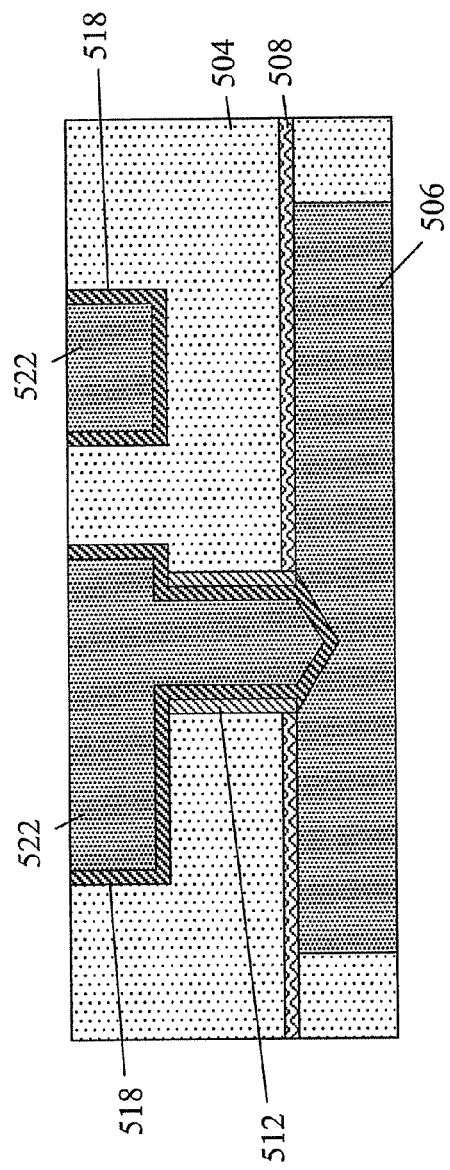
Fig. 5(e)
Fig. 5(f)

US 7,951,708 B2

COPPER INTERCONNECT STRUCTURE WITH AMORPHOUS TANTALUM IRIDIUM DIFFUSION BARRIER

BACKGROUND

The present invention relates generally to semiconductor device manufacturing techniques and, more particularly, to a copper interconnect structure with an amorphous tantalum iridium diffusion barrier.

As integrated circuit device size continues to shrink in order to achieve higher operating frequencies, lower power consumption, and overall higher productivity, the copper interconnections formed by the so-called dual damascene process have faced increasing difficulties with respect to both manufacturing and performance. In particular, since the interconnect feature sizes (e.g., the width of the copper lines and the diameter of the via holes) are getting smaller, filling of the etched trench/via structures with copper by electroplating becomes more difficult. Electroplating of copper takes place on a copper seed layer that, in turn, is formed on top of a liner material by physical vapor deposition (PVD).

However, because of the limited conformity of the copper seed layer, the seed layer may have one or more discontinuities therein. At such locations where the copper seed is discontinuous, the surface of the liner therebeneath (which is usually tantalum (Ta) or tantalum nitride (TaN)) working as a copper diffusion barrier becomes exposed to the air after the PVD process and gets oxidized. Consequently, the electroplating of copper does not take place on top of the oxidized liner surface because the electron supply for copper ions (which is a necessary reaction for the electroplating of copper) is inhibited at the oxidized liner surface. As a result, the discontinuous portion of the seed layer has an interface with copper wherein the atomic bonding is so weak that the discontinuity works as a void nucleation site during the annealing process. The annealing process in turn is used to grow the copper grains large for reliability enhancement of the interconnect system. Subsequently, the void nucleation site causes void formation either during the annealing process or the subsequent heating processes to form further metal layers to complete the chip manufacturing. It is also possible that void nucleations may adversely affect chip operation due to electromigration or other stress-induced migration phenomena. In summary, such void nucleations result in either low production yield or low product reliability.

SUMMARY

In an exemplary embodiment, a method of forming a diffusion barrier for use in semiconductor device manufacturing includes depositing, by a physical vapor deposition (PVD) process, an iridium doped, tantalum based barrier layer over a patterned interlevel dielectric (ILD) layer, wherein the barrier layer is deposited with an iridium concentration of at least 60 atomic % such that the barrier layer has a resulting amorphous structure.

In another embodiment, a diffusion barrier structure for a semiconductor device includes an iridium doped, tantalum based barrier layer formed over a patterned interlevel dielectric (ILD) layer; wherein the barrier layer is formed with iridium concentration of at least 60 atomic % such that the barrier layer has a resulting amorphous structure.

In another embodiment, a method of forming a semiconductor device includes forming one or more dual damascene trench and via structure patterns in an interlevel dielectric (ILD) layer, the interlevel dielectric layer formed over a lower conductor layer; depositing, by a physical vapor deposition (PVD) process, a sacrificial layer over the patterned ILD layer and exposed portions of the lower conductor layer, the sacrificial layer comprising a first iridium doped, tantalum based layer; selectively removing horizontal surfaces of the sacrificial layer and forming a divot in the lower conductor layer; and depositing, by PVD, a barrier layer over the ILD layer, remaining vertical portions of the sacrificial layer, and the exposed portions of the lower conductor layer corresponding to the divot, the barrier layer comprising a second iridium doped, tantalum based layer; wherein both the sacrificial and barrier layers are deposited with an iridium concentration of at least 60 atomic % so as to have a resulting amorphous structure.

In another embodiment, a method of forming a semiconductor device includes forming a via pattern in an interlevel dielectric (ILD) layer, the interlevel dielectric layer formed over a lower conductor layer; depositing, by a physical vapor deposition (PVD) process, a sacrificial layer over the patterned ILD layer and exposed portions of the lower conductor layer, the sacrificial layer comprising a first iridium doped, tantalum based layer; selectively removing horizontal surfaces of the sacrificial layer and forming a divot in the lower conductor layer; patterning one or more trenches in the ILD layer; depositing, by PVD, a barrier layer over the ILD layer, remaining vertical portions of the sacrificial layer, and the exposed portions of the lower conductor layer corresponding to the divot, the barrier layer comprising a second iridium doped, tantalum based layer; wherein both the sacrificial and barrier layers are deposited with an iridium concentration of at least 60 atomic % so as to have a resulting amorphous structure.

BRIEF DESCRIPTION OF THE SEVERAL VIEWS OF THE DRAWINGS

Referring to the exemplary drawings wherein like elements are numbered alike in the several Figures:

FIGS. 5(a) through 5(f) illustrate a sequence of exemplary process flow steps incorporating the amorphous, Ir-doped liner technique with a Spang via formation, in accordance with another embodiment of the invention.

DETAILED DESCRIPTION

Figure 1A:
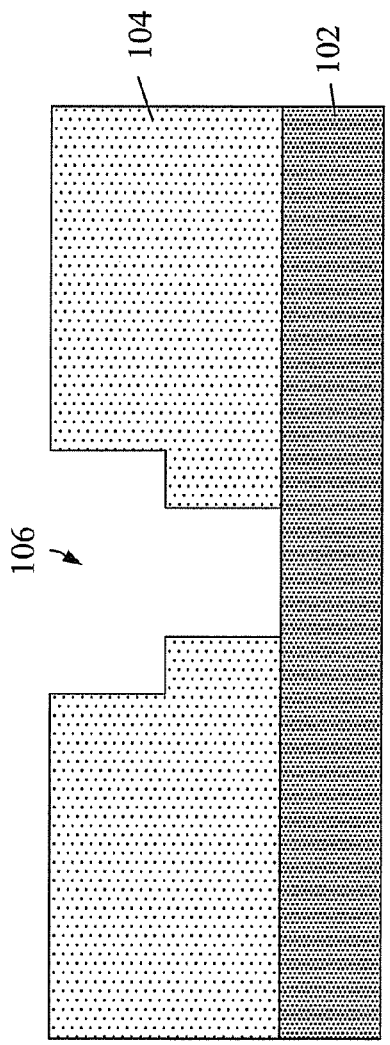
FIGS. 1(a) through 1(d) are a series of cross sectional views illustrating a method of forming a diffusion barrier for use in semiconductor device manufacturing, in accordance with an embodiment of the invention.

In order to address the problem of void nucleation with respect to copper formation, noble metals such as ruthenium (Ru) have been investigated as an alternative material for a Ta liner. In contrast to Ta, Ru acts as a seed layer for copper electroplating. Even if there are discontinuous portions in the copper seed layer, any air-exposed, discontinuous portions of Ru are not oxidized and thus serve as an electroplating seed layer. However, in order for the Ru layer to be conformal to the device features, it must be formed by either a chemical vapor deposition (CVD) or an atomic layer deposition (ALD) process. Such a deposition of Ru requires another process chamber, in addition to the conventional Ta PVD chamber in a vacuum continuous cluster processing system. Unfortunately, this results in an increase in the production cost.

Another solution which has been investigated is to use a Ru-doped Ta liner or a Ru-doped TaN liner, instead of Ta and TaN liner materials. The objective in this approach is to have the liner material function both as a barrier layer to protect against copper and water diffusion, and as the electroplating seed layer. Further, by using Ru-doped Ta PVD, a conventional PVD system can be used without adding any other process chambers. However, in practice, Ru-doped Ta films have a polycrystalline microstructure wherein Ru crystallines are buried in amorphous Ta or TaN. Consequently, the grain boundaries of Ru and the interface of Ru grains and the Ta phase allow copper atoms to diffuse along the grain boundaries and the interfaces. Therefore, the Ru-doped Ta films do not work as an effective diffusion barrier against copper and water diffusion, although it works as the electroplating seed layer.

Accordingly, disclosed herein is a diffusion barrier for use in semiconductor device manufacturing that may be incorporated into a PVD process. In brief, the embodiments utilize iridium (Ir) as a dopant to Ta, and in compositions and deposition conditions that create an amorphous microstructure and/or complete grain boundary stuffing. The creation of such an amorphous layer is advantageous for extendible Cu metallization, void-free filling. In order to form an amorphous film, the concentration of Ir in the Ir-doped Ta-based film should be at least about 60 atomic %.

The embodiments herein may include amorphous and stuffed alloys or mixtures, which in turn may also include the barrier metal nitride formations (e.g., $\alpha$—Ta(Ir) and $\alpha$-Ta(N, Ir). Such Ir-doped Ta films may be formed by PVD using the Ir-doped Ta PVD target. In contrast to Ru, the Ir-doped Ta films are tailored so as be amorphous; hence, there are no grain boundaries for fast outdiffusion of copper into the surrounding dielectric. Depending upon the specific composition of the film, there may also be efficient grain boundary stuffing that is thermally stable and forms a good diffusion barrier, unlike a dilute Ta—Ru system. Thus, because of the amorphous microstructure of the Ir-doped Ta films, the films can serve as a diffusion barrier, and as the electroplating seed layer for copper deposition.

A bilayer with Cu seed analogous to TaN/Ta/Cu is also contemplated, such as Ta(N, Ir)/Ta(Ir)/Cu. Here, at least the Ta(Ir) portion of the layer has an amorphous structure, although the Ta(N, Ir) may also be amorphous. On the other hand, if adhesion to the dielectric material is adequate (and superior diffusion barrier performance is established), then a bilayer may be omitted. In this case, only a single layer barrier with Cu seed is used, e.g., $\alpha$-Ta(Ir)/Cu or $\alpha$-Ta(N, Ir)/Cu.

As will also be discussed in further detail hereinafter, since the Ir-doped liner formation is performed in a single ionized PVD chamber, the process is also compatible with other more recently developed techniques. For example, the Ir-doped liner technique can be used with the so-called "sacrificial liner" or "barrier-first" steps associated with via gouging through a first liner layer into the copper line below, followed by deposition of a second (Ir-doped) liner layer and Cu seed. In any case, copper interconnection systems which implement such Ir-doped Ta films disclosed herein as the liner material in the copper damascene process can have high reliability and high production yield, because of the elimination of the void nucleation site at the liner/copper interface.

Figure 1B:
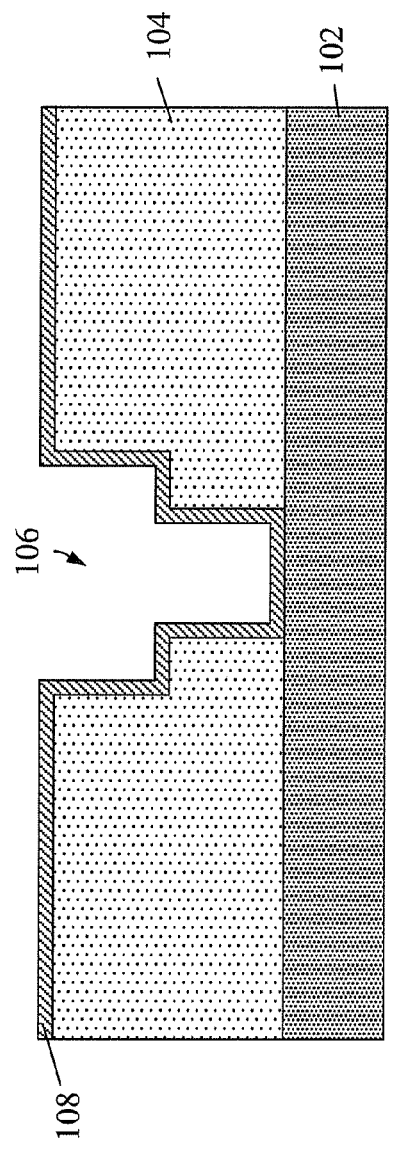

Referring now to FIG. 1(a), there is shown a cross-sectional view depicting a dual damascene interconnection process, to which the present diffusion barrier embodiments may be applied. In particular, a lower metal layer 102 has an interlevel dielectric (ILD) layer 104 (e.g., a low-K material) formed thereon. As is shown, the ILD layer 104 is patterned in a dual damascene fashion (i.e., with a via and trench opening), generally indicated at 106. Then, as shown in FIG. 1(b), an Ir-doped, Ta-based barrier layer 108 is formed by PVD. More particularly, the barrier layer 108 is formed, for example, by a DC-Magnetron sputter using a compound PVD target comprising Ta and Ir.

Figure 1C:
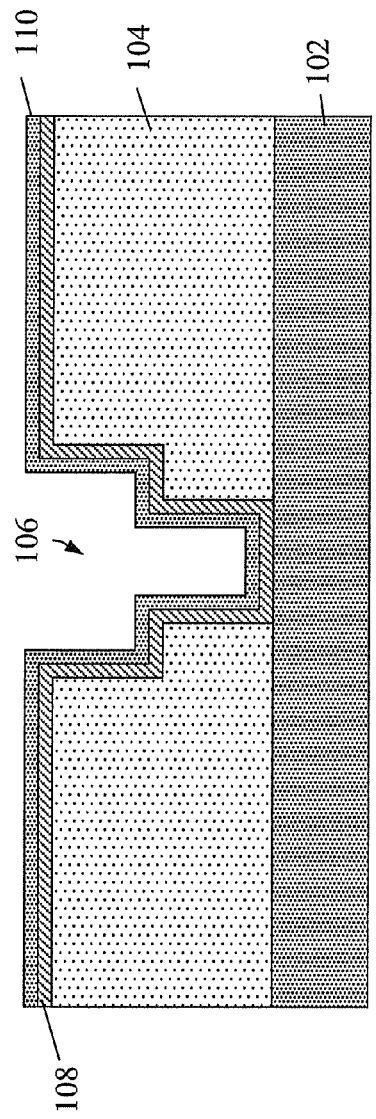
Figure 1D:
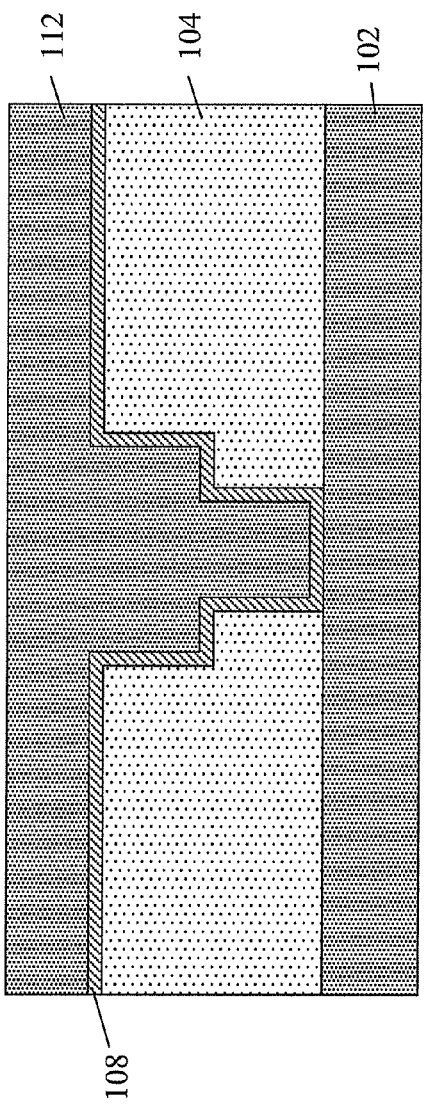
Figure 1E:
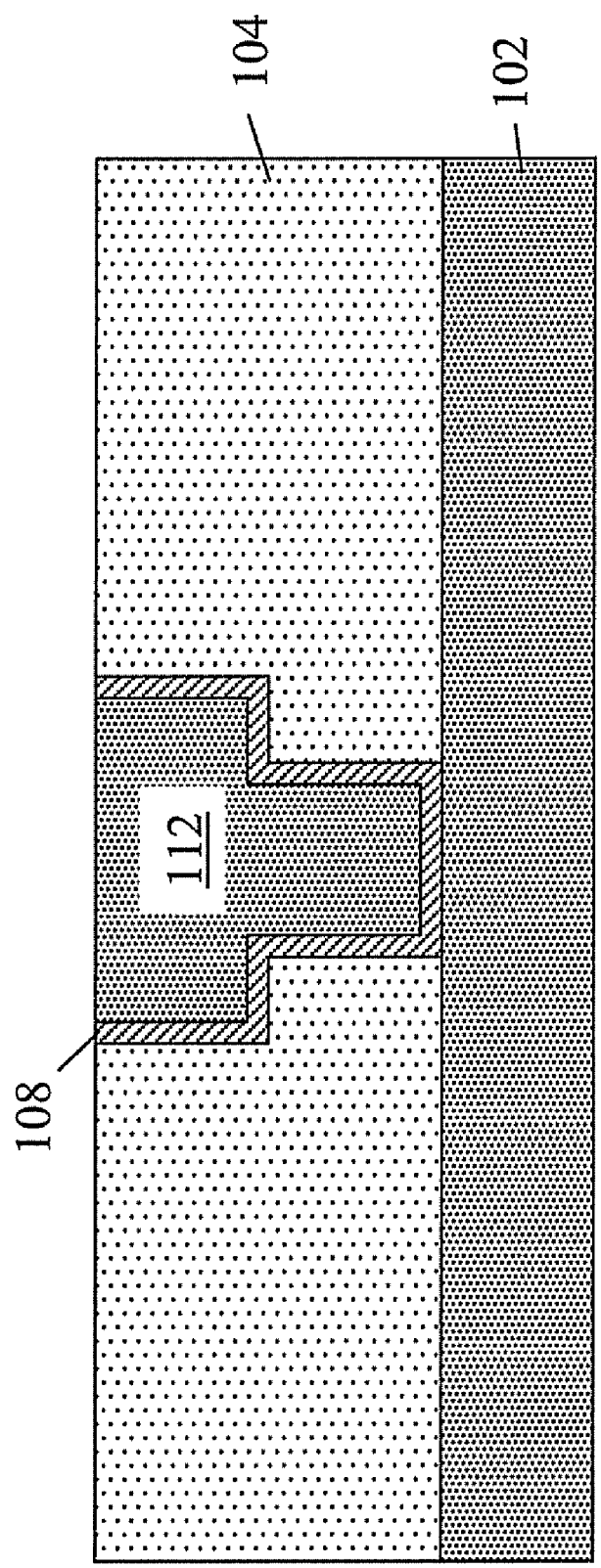

Again, in an exemplary embodiment, the relative concentrations of each component by atomic percent are about 40% or less for Ta and about 60% or more for Ir, such that the barrier layer 108 has an amorphous structure. A copper seed layer 110 is then formed on top of the Ir-doped Ta layer 108 by PVD, as shown in FIG. 1(c). The interface between the Ir-doped Ta and the copper has a higher atomic bonding or adhesion than a conventional Ta/Cu interface. Further, the copper seed layer 110 formed on top of the Ir-doped Ta layer 108 does not show agglomeration or dewetting even after being annealed at 400° C. for one hour, whereas a conventional Ta/Cu interface shows agglomeration after the same annealing. In FIG. 1(d), the remaining copper fill 112 is electroplated, followed by other conventional damascene processes such as chemical mechanical polishing (CMP) as shown in FIG. 1(e) and optionally subsequent CVD for a capping layer (not shown).

The copper interconnects formed by implementing the above described Ir-doped Ta liner does not demonstrate any appreciable void formation during the subsequent heating processes. In effect, the interface of the copper and the Ir-doped Ta has no discontinuous seed portions because of the compensating effect of the amorphous, Ir-doped Ta. Accordingly, the copper interconnects have higher electromigration and stress migration resistances.

Figure 2A:
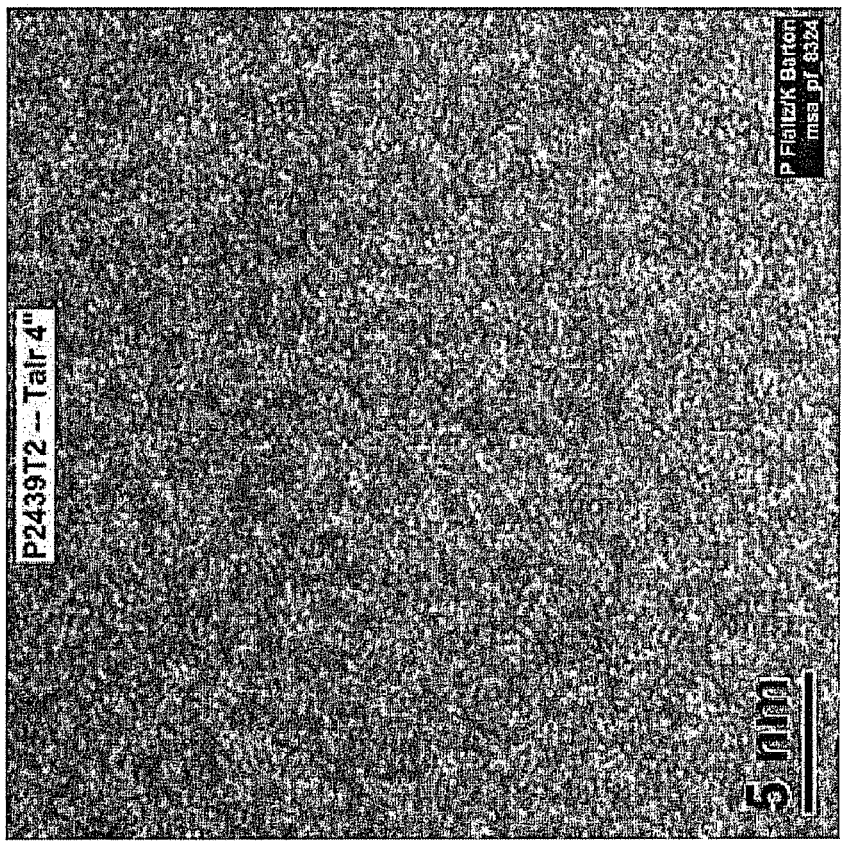
FIG. 2(a) is a transmission electron micrograph (TEM) image of an exemplary amorphous, Ir-doped Ta film.
Figure 2B:
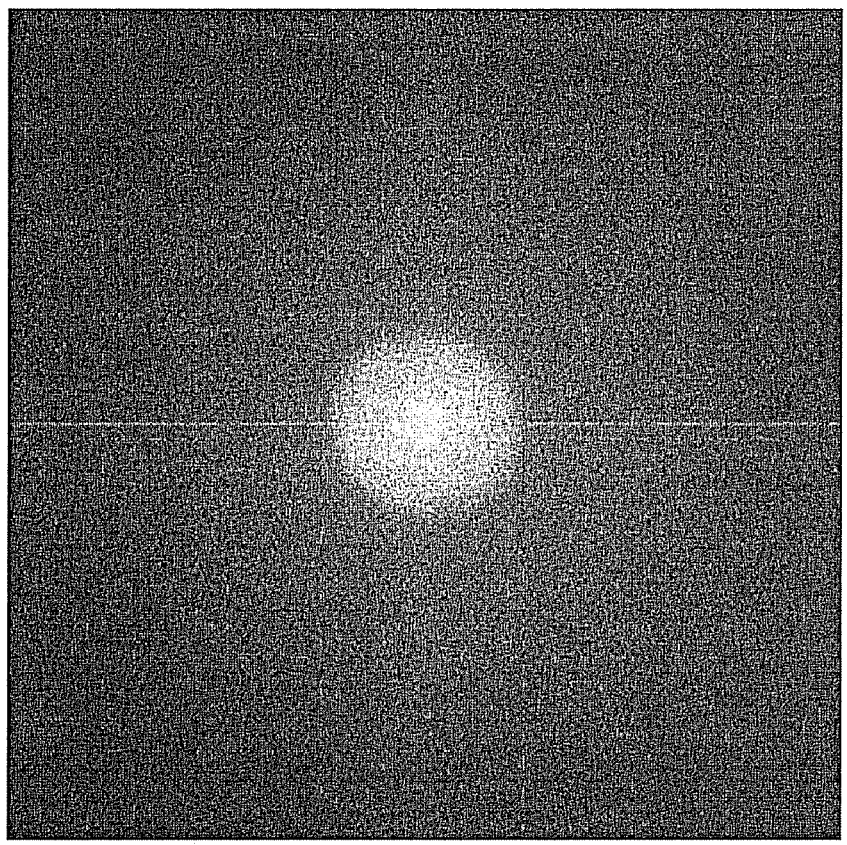
FIG. 2(b) is an electron diffraction pattern image of the Ir-doped Ta film of FIG. 2(a)
Figure 3B:
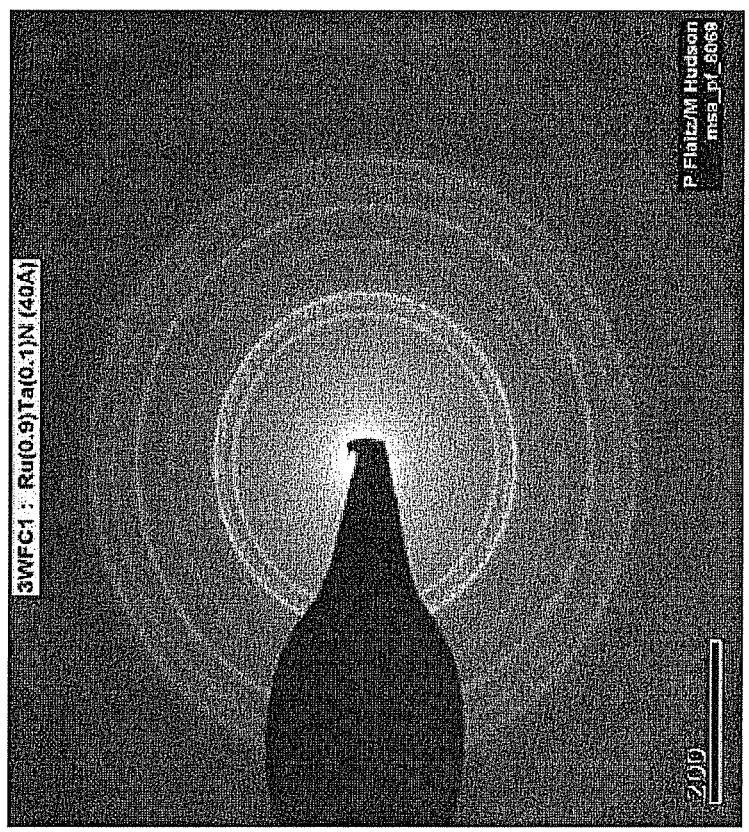
FIG. 3(b) is an electron diffraction pattern image of the Ru-doped Ta film of FIG. 3(a)
Figure 3A:
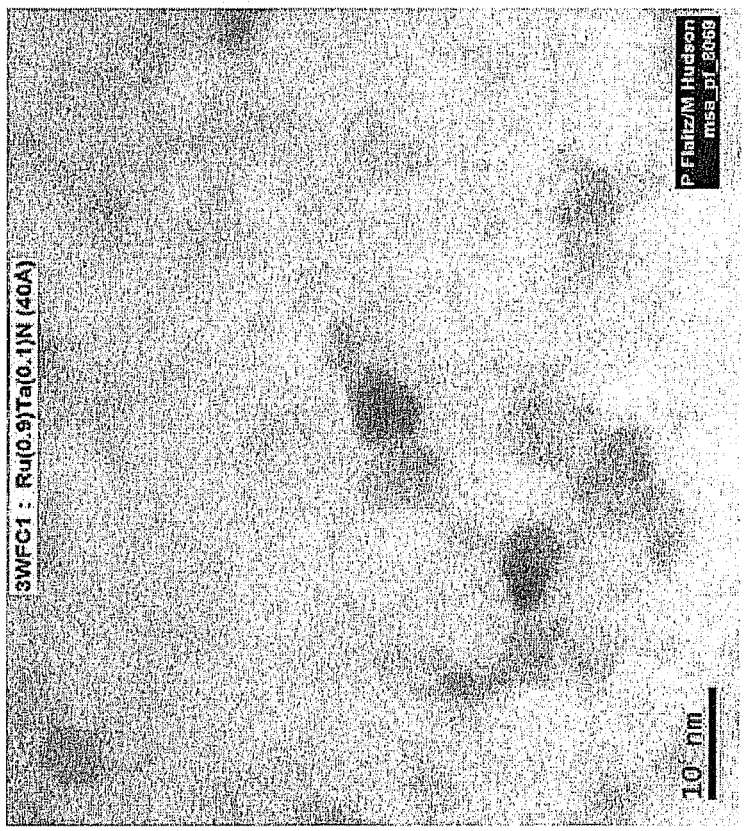
FIG. 3(a) is a TEM image of a Ru-doped TaN film.

As mentioned above, by using an Ir concentration of at least 60%, the resulting deposited barrier layer has an amorphous structure. FIG. 2(a) is a transmission electron micrograph (TEM) image of an exemplary amorphous, Ir-doped Ta film. FIG. 2(b) is an electron diffraction pattern image of the Ir-doped Ta film of FIG. 2(a), which illustrates its amorphous properties in the form of a single, bright dot in the center of the image. By way of comparison, FIG. 3(a) is a TEM image of a Ru-doped TaN film. FIG. 3(b) is an electron diffraction pattern image of the Ru-doped Ta film of FIG. 3(a), which illustrates its polycrystalline properties in the form of multiple, concentric bright circles in the image.

Figure 4A:
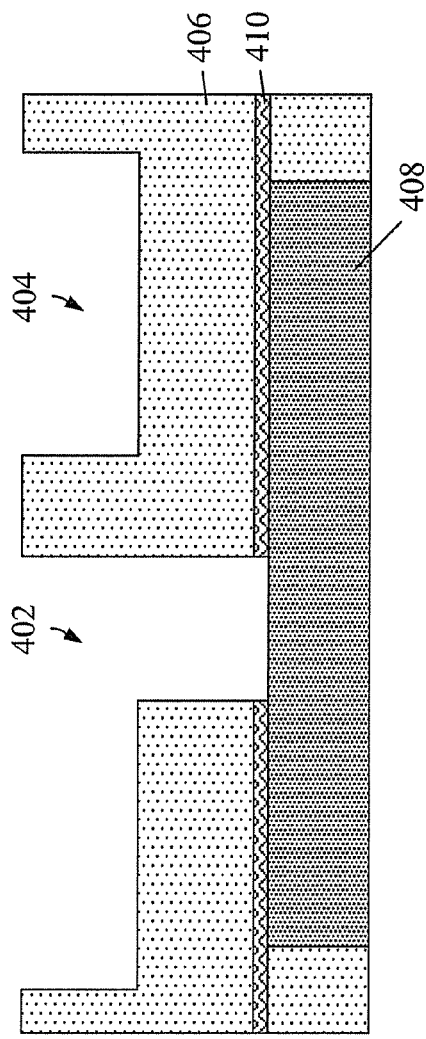
FIGS. 4(a) through 4(e) illustrate a sequence of exemplary process flow steps incorporating the amorphous, Ir-doped liner technique with a sacrificial liner step associated with via gouging, in accordance with another embodiment of the invention.

As also indicated previously, the Ir-doped liner technique can be used with the so-called "sacrificial liner" or "barrier-first" steps associated with via gouging through a first liner layer into the copper line below, followed by deposition of a second (Ir-doped) liner layer and Cu seed. FIGS. 4(a) through 4(e) illustrate a sequence of exemplary process flow steps in this regard. In FIG. 4(a), a dual damascene via/trench pattern 402 and trench pattern 404 are formed in ILD layer 406, which is in turn formed above a lower wiring layer 408. The via portion of via/trench pattern 402 is etched through a capping layer 410, stopping on the lower wiring layer 408.

Figure 4B:
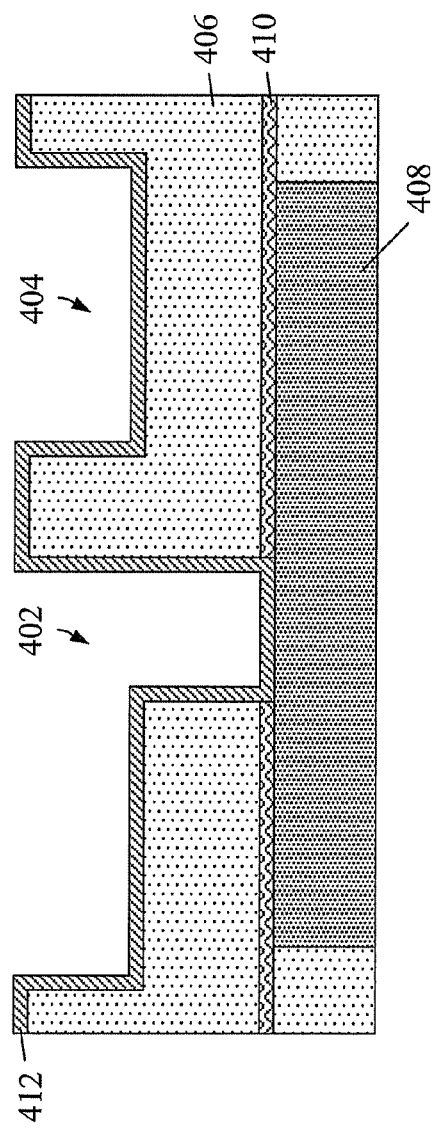
Figure 4C:
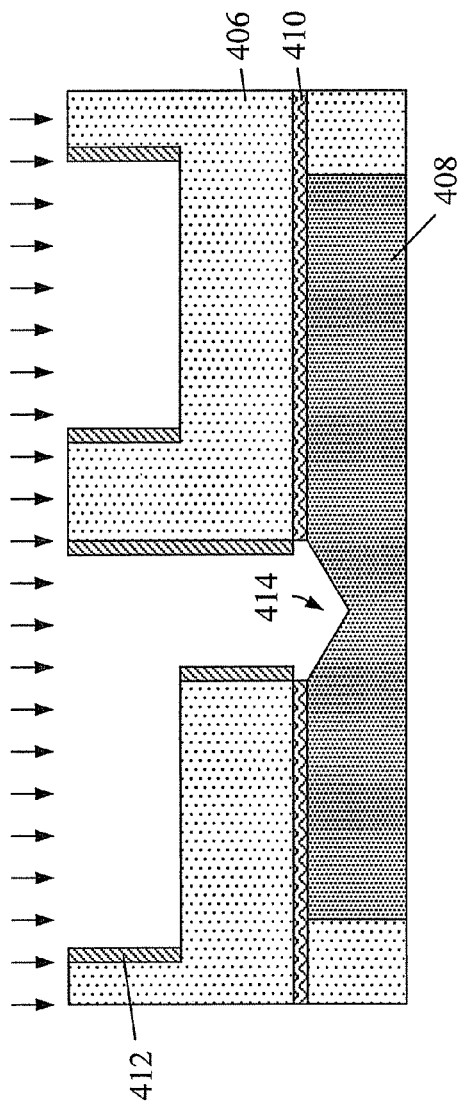
Figure 4D:
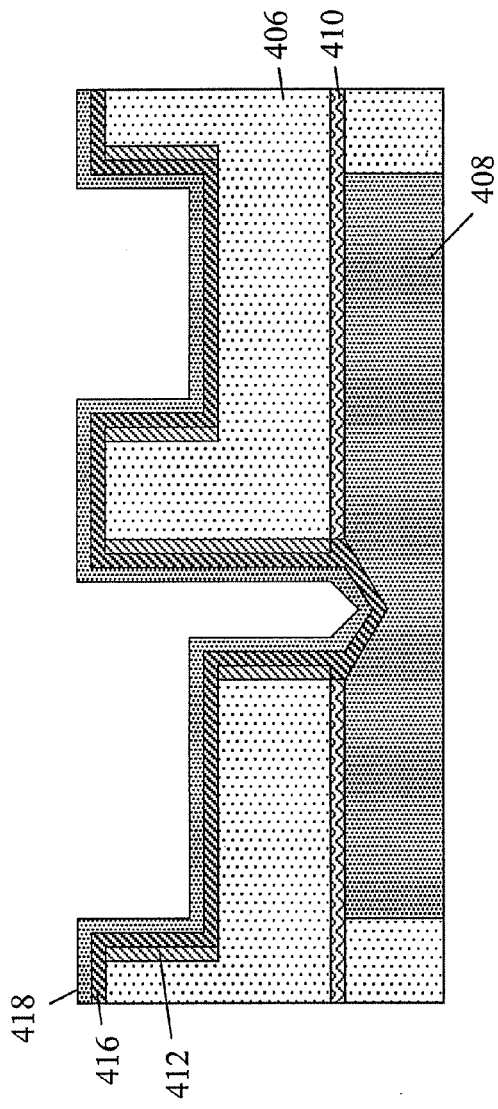
Figure 4E:
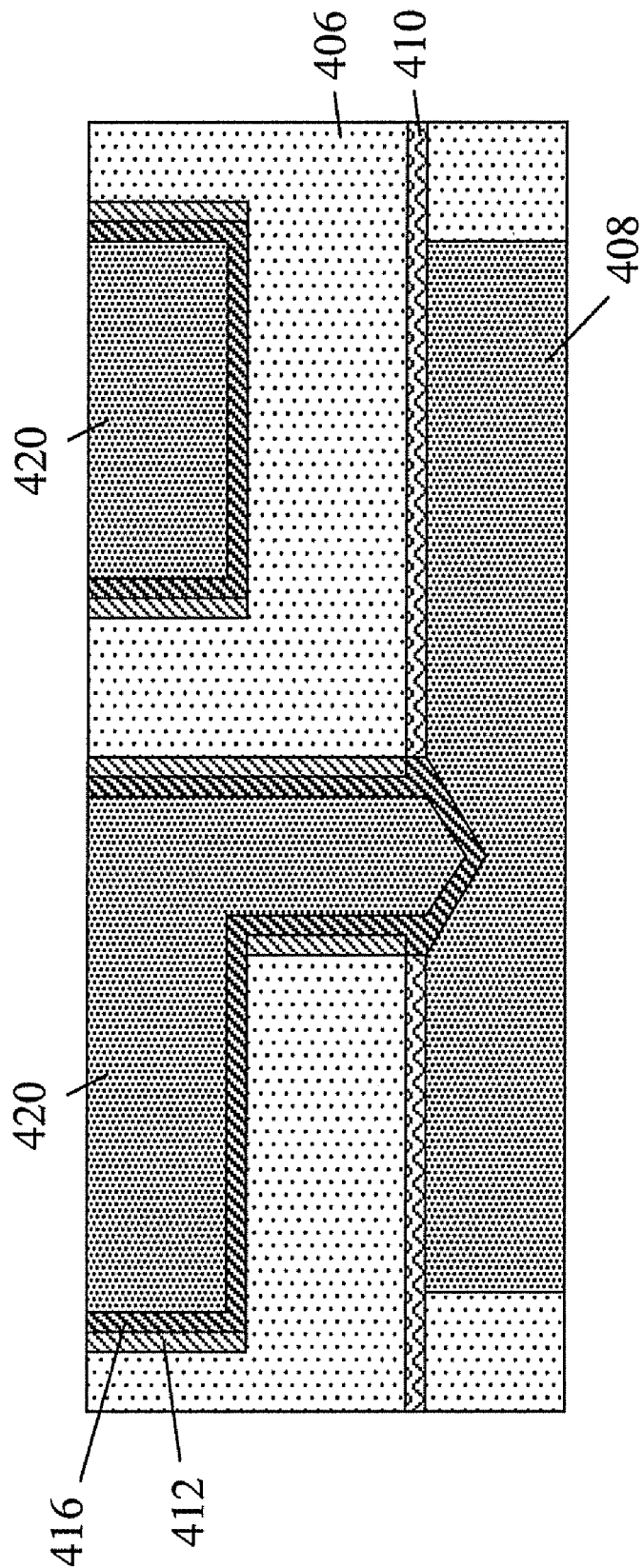

In FIG. 4(b), a sacrificial liner 412 is formed by PVD over the structure, wherein the sacrificial liner 412 is an Ir-doped Ta or TaN material of appropriate atomic concentrations so as to have an amorphous structure. As then shown in FIG. 4(c), the horizontal surfaces of the sacrificial liner 412 are removed by sputtering, for example, with a suitable substance such as argon (Ar) ions (indicated by the arrows). This process also results in a divot 414 formed in the exposed portion of the lower wiring layer 408. Upon formation of the divot 414, a barrier layer 416 of the type described above (e.g., amorphous, Ir-doped Ta) is formed, followed by a copper seed layer 418, as shown in FIG. 4(d). This is followed by completely filling the damascene trench and via structures with copper material 420, and subsequent chemical mechanical polishing (CMP) to result in the structure shown in FIG. 4(e). The device may thereafter be processed in accordance with known techniques.

Figure 5A:
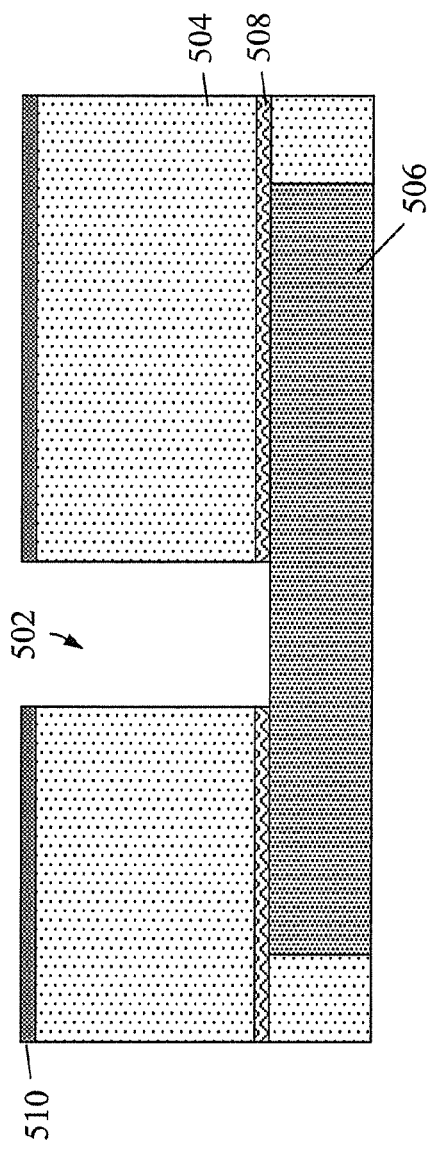

Finally, FIGS. 5(a) through 5(f) illustrate a sequence of exemplary process flow steps incorporating the amorphous, Ir-doped liner technique with a Spang via formation, in accordance with another embodiment of the invention. In FIG. 5(a), a via 502 is initially defined in ILD layer 504, which is in turn formed above a lower wiring layer 506. The via 502 is etched through a capping layer 508, stopping on the lower wiring layer 506. A hardmask layer 510 (e.g., silicon dioxide) is also shown formed on the ILD layer 504, which may be a low-K material, for example.

Figure 5B:
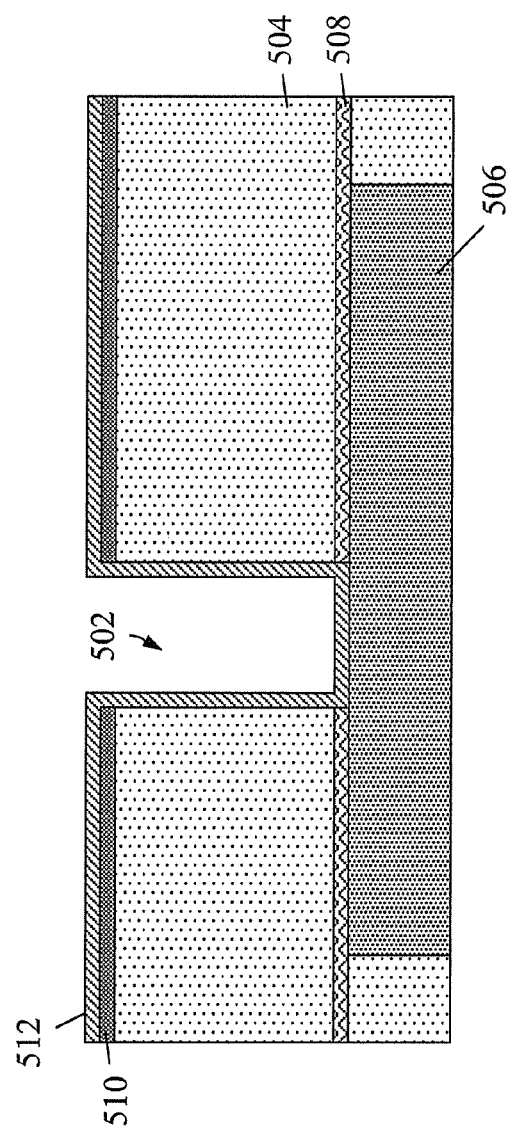
Figure 5C:
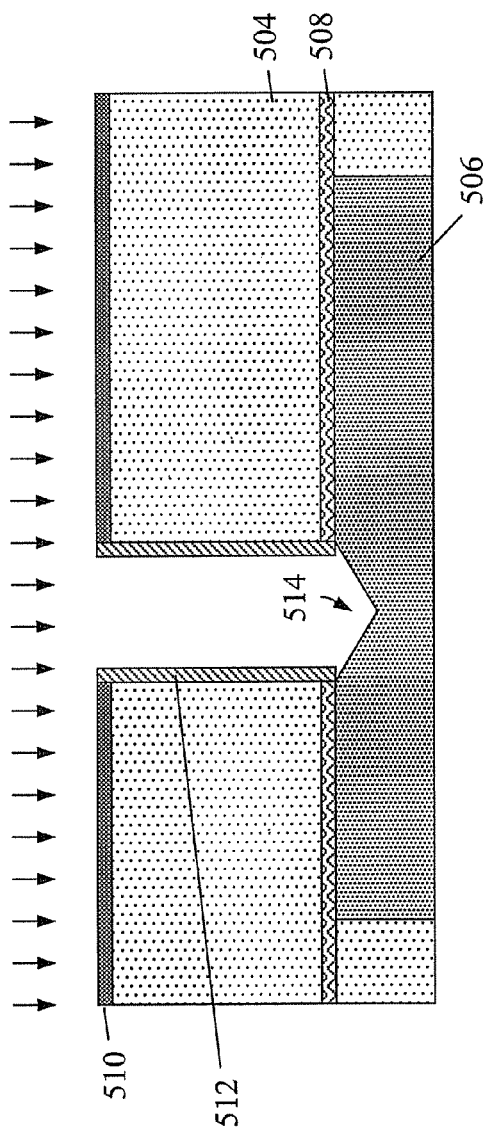
Figure 5D:
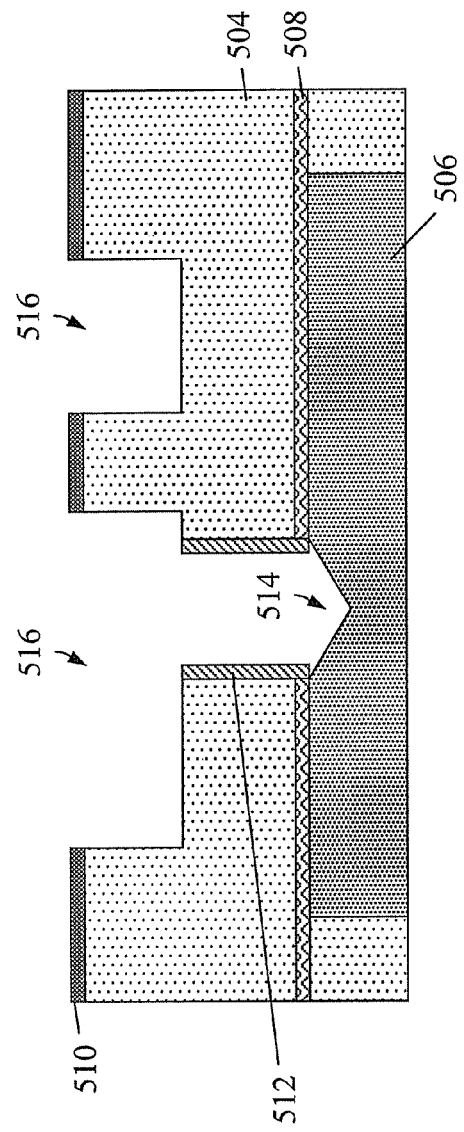

In FIG. 5(b), a sacrificial liner 512 is formed by PVD over the structure, wherein the sacrificial liner 512 is an Ir-doped Ta or TaN material of appropriate atomic concentrations so as to have an amorphous structure. As then shown in FIG. 5(c), the horizontal surfaces of the sacrificial liner 512 are removed by sputtering, for example, with a suitable substance such as argon (Ar) ions (indicated by the arrows). This process also results in a divot 514 formed in the exposed portion of the lower wiring layer 506. At this point, trench structures 516 are patterned and etched into the ILD layer 504, in accordance with known techniques as shown in FIG. 5(d).

Referring to FIG. 5(e), a barrier layer 518 of the type described above (e.g., amorphous, Ir-doped Ta) is formed, followed by a copper seed layer 520, as shown in FIG. 4(d). This is followed by completely filling the damascene trench and via structures with copper material 522, and subsequent chemical mechanical polishing (CMP) to result in the structure shown in FIG. 5(f). It is noted that the CMP removes the hardmask layer 510. The device may thereafter be processed in accordance with known techniques.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a diffusion barrier for use in semiconductor device manufacturing, the method comprising:
    depositing, by a physical vapor deposition (PVD) process, an iridium doped, tantalum based barrier layer over a patterned interlevel dielectric (ILD) layer;
    wherein the barrier layer is deposited with an iridium concentration exceeding 60 atomic % such that the barrier layer has a resulting amorphous structure.

2. The method of claim 1, wherein the barrier layer comprises one of an amorphous iridium tantalum ($\alpha$-TaIr) layer and an amorphous iridium tantalum nitride ($\alpha$-TaNIr) layer.

3. The method of claim 1, further comprising forming a copper seed layer on the barrier layer by PVD.

4. The method of claim 1, wherein the patterned ILD layer is patterned in a dual damascene configuration that exposes a top surface of a lower metal layer upon which the barrier layer is deposited.

5. A diffusion barrier structure for a semiconductor device, comprising:
    an iridium doped, tantalum based barrier layer formed over a patterned interlevel dielectric (ILD) layer;
    wherein the barrier layer is formed with iridium concentration of exceeding 60 atomic % by atomic weight such that the barrier layer has a resulting amorphous structure.

6. A method of forming a semiconductor device, the method comprising:
    forming one or more dual damascene trench and via structure patterns in an interlevel dielectric (ILD) layer, the interlevel dielectric layer formed over a lower conductor layer;
    depositing, by a physical vapor deposition (PVD) process, a sacrificial layer over the patterned ILD layer and exposed portions of the lower conductor layer, the sacrificial layer comprising a first iridium doped, tantalum based layer;
    selectively removing horizontal surfaces of the sacrificial layer and forming a divot in the lower conductor layer; and
    depositing, by PVD, a barrier layer over the ILD layer, remaining vertical portions of the sacrificial layer, and the exposed portions of the lower conductor layer corresponding to the divot, the barrier layer comprising a second iridium doped, tantalum based layer;
    wherein both the sacrificial and barrier layers are deposited with an iridium concentration exceeding 60 atomic % so as to have a resulting amorphous structure.

7. The method of claim 6, wherein the sacrificial layer comprises one of an amorphous iridium tantalum ($\alpha$-TaIr) layer and an amorphous iridium tantalum nitride ($\alpha$-TaNIr) layer.

8. The method of claim 7, wherein the barrier layer comprises an amorphous iridium tantalum nitride ($\alpha$-TaNIr) layer.

9. The method of claim 7, further comprising forming a copper seed layer on the barrier layer by PVD.

10. A method of forming a semiconductor device, the method comprising:
    forming a via pattern in an interlevel dielectric (ILD) layer, the interlevel dielectric layer formed over a lower conductor layer;
    depositing, by a physical vapor deposition (PVD) process, a sacrificial layer over the patterned ILD layer and exposed portions of the lower conductor layer, the sacrificial layer comprising a first iridium doped, tantalum based layer;
    selectively removing horizontal surfaces of the sacrificial layer and forming a divot in the lower conductor layer;
    patterning one or more trenches in the ILD layer;
    depositing, by PVD, a barrier layer over the ILD layer, remaining vertical portions of the sacrificial layer, and the exposed portions of the lower conductor layer corresponding to the divot, the barrier layer comprising a second iridium doped, tantalum based layer;

wherein both the sacrificial and barrier layers are deposited with an iridium concentration exceeding 60 atomic % so as to have a resulting amorphous structure.

11. The method of claim 10, wherein the sacrificial layer comprises one of an amorphous iridium tantalum (α-TaIr) layer and an amorphous iridium tantalum nitride (α-TaNIr) layer.

12. The method of claim 11, wherein the barrier layer comprises an amorphous iridium tantalum nitride (α-TaNIr) layer.

13. The method of claim 11, further comprising forming a copper seed layer on the barrier layer by PVD.

* * * * *